United States Patent [19]

Moody

[11] Patent Number: 5,726,481
[45] Date of Patent: Mar. 10, 1998

[54] POWER SEMICONDUCTOR DEVICE HAVING A TEMPERATURE SENSOR

[75] Inventor: Paul T. Moody, Oldham, United Kingdom

[73] Assignee: U.S. Philips Corporation, New York, N.Y.

[21] Appl. No.: 673,835

[22] Filed: Jun. 27, 1996

[30] Foreign Application Priority Data

Jun. 30, 1995 [GB] United Kingdom .............. 9513420

[51] Int. Cl.$^6$ .................................................. H01L 31/058
[52] U.S. Cl. ......................... 257/467; 257/470; 257/659
[58] Field of Search .................................. 257/467, 470, 257/659

[56] References Cited

U.S. PATENT DOCUMENTS

| | | | |
|---|---|---|---|
| 4,984,200 | 1/1991 | Saitoo | 257/659 |
| 5,050,238 | 9/1991 | Tomizuka | 257/659 |

FOREIGN PATENT DOCUMENTS

| | | | |
|---|---|---|---|
| A0224274 | 11/1986 | European Pat. Off. | |
| A0409214 | 7/1990 | European Pat. Off. | |
| A0414499 | 8/1990 | European Pat. Off. | |
| A0479362 | 9/1991 | European Pat. Off. | |
| A0488088 | 11/1991 | European Pat. Off. | |
| A0523798 | 7/1992 | European Pat. Off. | |
| 59-13358 | 1/1984 | Japan | 257/467 |

OTHER PUBLICATIONS

*IEEE Elec. Dev Lett.* vol. 16 No. 9 Sep. 1995 Iwamuro et al. "A New Vertical IGBT . . . Circuit".

*Primary Examiner*—Jerome Jackson
*Attorney, Agent, or Firm*—Steven R. Biren

[57] ABSTRACT

A power semiconductor device (e.g. MOSFET or IGBT) has a temperature sensing means in the form of thin-film sensing element (D1) on a first insulating layer (2) on the device body (10). The sensing element is preferably a reverse-biased p-n junction thin-film polycrystalline silicon diode (D1). In order to screen the sensitive element (D1) from electrical noise, an electrically conductive layer (4) is present on a second electrically insulating layer (5) over the thin-film element (D1) and forms part of an electrical screen (3,4) which is present over and under the thin-film element (D1). This electrical screen (3,4) also comprises a semiconductive region (3) underlying the thin-film element (D1), with the overlying conductive layer (4) electrically connected to the semiconductive region (3) at a window (6) in the insulating layers (2,5). One electrical connection of the thin-film element (D1) may be formed by the screening conductive layer (4) extending through a contact window (46) in the second insulating layer (5) and connected to a stable reference potential (e.g. ground). The electrical screen (3,4) can be integrated around the thin-film element (D1) in the same process steps as are already used for power device fabrication, but with modified mask layouts for providing the desired geometry in accordance with the invention. The overlying screening conductive layer (4) may be a main electrode (e.g. source) of the power semiconductor device.

17 Claims, 5 Drawing Sheets

POWER SEMICONDUCTOR DEVICE HAVING A TEMPERATURE SENSOR

BACKGROUND OF THE INVENTION

This invention relates to power semiconductor devices (for example insulated-gate field-effect transistors, commonly termed "MOSFET" devices, and insulated-gate bipolar transistors commonly termed "IGBT" devices), in which heat is generated during operation of the power semiconductor device, and in which the device comprises a temperature sensing means for the body. The temperature sensing means may be used to switch off the power semiconductor device when a given temperature is exceeded, so protecting the device in an overload situation. The power semiconductor device may also comprise other forms of protective circuitry, control circuitry and other logic circuitry (integrated in and on the semiconductor body) and so may be a so-called "smart-power" device.

The use of temperature sensing means for regulating the operation of the power semiconductor device (and hence its heat generation) is of particular interest in the field of "smart-power" devices, both to protect the power device section from over-heating and to maintain proper operation of its logic circuitry. Control functions provided by low-voltage logic circuit elements are integrated at low cost with a higher-voltage power device to provide intelligent power switches for use in high-volume applications, for example such as automotive control systems. Such devices may be used, for example, in electronic control for the ignition system of an internal combustion engine or in switching the lamps or electric motors of an automobile. An improper logic function may result from an excessive temperature increase.

Published European Patent Application EP-A-0 414 499 discloses a power semiconductor device with a temperature sense element closely coupled to the semiconductor body (the substrate) in which heat is generated during operation of the power semiconductor device. There is a first electrically insulating layer adjacent to one major surface of the body, and this first insulating layer is present on an underlying semiconductive region of the body. The temperature sensing means for the body comprises a thin-film sensing element which is present on this first insulating layer on the semiconductive region.

FIGS. 1 and 2 of EP-A-0 414 499 are based on prior art of Tsuzuki et al which is described in a conference article referenced in EP-A-0 414 499. This Tsuzuki et al prior art is also described in published European Patent Application EP-A-0 224 274. In this FIG. 2 of EP-A-0 414 499 the thin-film sensing element of polycrystalline silicon is present on a thick first insulating layer, which is a field-oxide layer of the power device. The temperature sensing element on this field-oxide layer is present over an n-type well or "tub" in and on which control circuitry is integrated in the form of a bi-stable latch responsive to the temperature sensing element. The n-type well may be formed simultaneously with n-type channel "body" regions of the power semiconductor device, which is in this case an enhancement p-channel power DMOSFET.

FIG. 4 of EP-A-0 414 499 shows a modification of the Tsuzuki prior art, in which the temperature sensing element is provided on an insulating layer which is thinner than the field-oxide layer. This thinner insulating layer may be formed in the same way as the thin gate dielectric layer of the power MOSFET device. In the particular example of FIG. 4, the power MOSFET is an enhancement n-channel device, and the control circuitry is formed in and on a semiconductive region of p-type conductivity. The temperature sensing element is mounted on only a thin insulating layer in order to improve its thermal response to temperature changes in the semiconductor body.

As described in EP-A-0 224 274 and EP-A-0 414 499, the thin-film temperature sensing element is advantageously formed as a polycrystalline silicon p-n diode. Generally the temperature-dependence of the forward characteristic of this diode is used for temperature sensing. The reverse characteristic of a p-n junction diode is known to have a stronger temperature dependence than the forward characteristic. Thus, the leakage current of a reverse-biased p-n junction increases exponentially with temperature (Absolute Temperature, in degrees Kelvin). However, the magnitude of the reverse leakage current in the temperature range from 100° C. (Celsius) to 200° C. is much weaker than the forward current, for a given p-n junction area. Published European Patent Applications EP-A-0 409 214 and EP-A-0 488 088 teach the use of the reverse characteristic of a p-n junction diode for temperature sensing in a power semiconductor device. In order to obtain a high sensing current, the diode is formed with a large junction area by a doped region in the same semiconductor substrate as the power device, and the reverse leakage current is also amplified before use.

The whole contents of EP-A-0 224 274, EP-A-0 414 499, EP-A-0 409 214 and EP-A-0 488 088 are hereby incorporated herein as reference material.

When designing such temperature sensing elements (in thin-film or substrate form) for a power semiconductor device in such a way as to have a very sensitive thermal response to temperature changes in the semiconductor body, the present inventor finds that the temperature sensing element sometimes provides a false indication of the body temperature, which may result in the power semiconductor device being switched off (or otherwise regulated) unnecessarily and undesirably. Although such temperature sensing is particularly useful for smart power switches in high-volume applications such as automotive control systems, the present inventor finds that the prior art types of temperature sensing element may quite frequently give a false indication of body temperature in such applications.

SUMMARY OF THE INVENTION

It is an aim of the present invention to reduce the incidence of such false temperature indications while permitting the design of and use of temperature sensing elements having a high sensitivity.

According to the present invention there is provided a power semiconductor device comprising a semiconductor body in which heat is generated during operation of the power semiconductor device, a first electrically insulating layer adjacent to one major surface of the body, which first insulating layer is present on an underlying semiconductive region of the body, and a temperature sensing means for the body comprising a thin-film sensing element which is present on the first insulating layer on the semiconductive region, characterised in that an electrically conductive layer is present on a second electrically insulating layer over the thin-film sensing element, and in that an electrical screen is present over and under the thin-film sensing element, the electrical screen being formed by the electrically conductive layer overlying the thin-film sensing element and by the semiconductive region underlying the thin-film sensing element, and by the electrically conductive layer being electrically connected to the semiconductive region.

By providing an electrical screen formed in this way both over and under the thin-film sensing element, the present inventor finds that the incidence of false temperature indications is reduced, and that a highly sensitive sensing element (for example, using a reverse-biased p-n junction) may be integrated at low-cost in a power semiconductor device designed for high-volume applications. Thus, work by the present inventor indicates that many false temperature indications are the result of screenable electrical noise in the operational environment of the power semiconductor device. Such noise may arise and/or be transmitted in an inductive or capacitive manner from the environment around the power semiconductor device and/or from various parts of the power semiconductor device. Problematic excursions in voltage levels and current levels may result, for example, from operational fluctuations of the electrical supply in a motor vehicle and/or from use of the power semiconductor device in switching inductive loads. Noise may result from voltage spikes on the supply lines of the power semiconductor device. In an automotive application, electromagnetic interference may arise from, for example, the high voltage ignition coils of an internal-combustion engine, and/or from an audio system and/or from an automotive radar system. The electrical screen formed in accordance with the present invention can significantly reduce the transmission of such noise to the sensing element both from other parts of the semiconductor device and directly from the environment around the semiconductor device. Capacitive currents can be reduced (and some eliminated) by electrically screening the thin-film sensing element in this manner.

Within the semiconductor body of the device there may be a major substrate area which is associated with an opposite electrode of the device and which is a particularly bad source of noise. In the case of a substrate p-n diode sensor (such as in EP-A-0 409 214 and EP-A-0 488 088), the large area of the reverse-biased p-n junction results in a large junction capacitance and is associated in the semiconductor substrate with parasitic bipolar transistor structures which also develop leakage currents. When dV/dt variations occur (for example, during device turn-on or as a result of power supply excursions) significant capacitive currents may flow in this substrate region structure, and these transient currents may swamp the thermally-generated leakage current so giving a false indication of the substrate temperature. A thin-film sensor (such as in EP-A-0 224 274 and EP-A-0 414 499), is separated from the substrate by being provided on an insulating layer. However, capacitive coupling may then occur between the thin-film sensing element and neighbouring tracks or other circuit parts on the insulating layer. Furthermore, the thinning of this underlying insulating layer (so as to increase the thermal response) increases the capacitive coupling between the thin-film sensor and the underlying circuit region and/or underlying opposite main electrode region of the device. The present inventor finds that a false temperature indication may arise from these types of capacitive coupling.

In a device in accordance with the present invention the thin-film sensing element is protected by the screening effect of the underlying semiconductive region connected to the overlying electrically conductive layer. This form of an electrical screen in accordance with the present invention may be formed easily without any additional processing steps, merely by changing the mask layout for the insulating layers and the semiconductive and electrically conductive layers of the power semiconductor device. The electrically conductive layer may be electrically connected to the semiconductive region through an elongate contact window which extends side-by-side with the thin-film sensing element along one side of the sensing element. This provides very good electrical screening along that side of the sensing element. In order to extend the side screening, the elongate contact window may extend side-by-side with the thin-film sensing element around most of the perimeter of the sensing element, for example along three sides of a sensing element of square or rectangular perimeter, and even along part of its fourth side. However, a somewhat less efficient side-screening effect may be acceptable along one or more of the sides and can be achieved by extending both the underlying semiconductive region and the overlying electrically conductive layer laterally beyond the thin-film sensing element by a distance which is an order of magnitude (e.g. about 10 or more times) larger than the thickness of the intermediate first and second electrically insulating layers.

In order to reduce the number of conductor tracks or other electrical connections which need to pass through the electrical screen, it is convenient to use the electrically conductive layer to form one electrical connection of the thin-film sensing element. For this purpose, the electrically conductive layer may extend through a contact window in the second electrically insulating layer to form this electrical connection, and it may have a circuit connection for connecting this electrical connection of the thin-film sensing element to a stable reference potential (for example, ground potential) in operation of the device.

The electrically conductive layer may be a main electrode of the power semiconductor device adjacent to the said one major surface of the body. Thus, the electrical screen over the thin-film sensing element may be formed by merely extending laterally a conductive layer which is already present in the power semiconductor device as a main electrode layer. Furthermore, the semiconductive region forming the electrical screen under the thin-film sensing element may be related to a main device region contacted by that main electrode. Thus, the screening semiconductive region may be formed by a lateral extension of the main device region or may be formed simultaneously with the main device region or may be associated with a region which is short-circuited to the main device region by the main electrode.

The screening semiconductive region underlying the thin-film sensing element may be a first region of one conductivity type which is separated in the semiconductor body from a second region of the one conductivity type also adjacent to the one major surface. This second region may be a so-called "circuit well". The thin-film sensing element may be electrically connected to (sense) circuitry integrated in and on the second region. The sense circuitry may form part of additional low-voltage control circuitry integrated in and on the second region. Because the first screening region underlying the thin-film sensing element is separated from the circuit well, good isolation of the thin-film sensing element from this second region and its circuitry can be obtained. This is important if the circuit well is biased at a different reference voltage from the first region and/or if large capacitive currents flow locally in the circuit well. Thus, it is more advantageous than the arrangements in EP-A-0 224 274 and EP-A-0 414 499 in which the thin-film sensing element is present over the circuit region in and on which the control circuitry is integrated. By separating the first semiconductive region from the second semiconductive region in and on which the circuitry is integrated, any capacitive coupling between the thin-film sensing element and this circuit region can be reduced to a very low value. Furthermore, the first semiconductive region underlying the thin-film sensing element screens the thin-film sensing element from the underlying body portion (for example a drain-drift region) of the power semiconductor device. Thus, any capacitive coupling of the thin-film sensing element to this underlying body portion can also be reduced to a very low value.

The power semiconductor device may be of a type comprising an insulated gate for controlling current flow in a channel area of the device in operation of the device. The thin-film sensing element may be located to one side of the insulated gate, and the channel area of the device may be formed in an extension of the semiconductive region of one conductivity type which provides the electrical screen. Thus, a compact layout arrangement with the regions of the power semiconductor device can be achieved. A source region of opposite conductivity type may be present in the semiconductive region between the channel area and a contact area where the electrically conductive layer (which provides the electrical screen over the thin-film sensing element) may be connected to the semiconductive region in which the channel area is formed and which provides the electrical screen under the thin-film sensing element.

Particularly when the thin-film sensing element has a high sensitivity (for example in the form of a reverse-biased p-n junction diode), it is advantageous for the sense and control circuitry to include a hysteresis circuit. The hysteresis circuit prevents the temperature sensing circuitry from hunting or cycling, i.e from continually causing the power semiconductor device to be switched off when only small temperature changes are sensed by the thin-film sensing element. The use of such hysteresis circuits is already known in, for example, published European Patent Applications EP-A-0 523 798 (U.S. Pat. No. 5,444,219; our reference: PHB 33735) and EP-A-0 479 362 (our reference: PHB 33667), the whole contents of which are hereby incorporated herein as reference material. EP-A-0 523 798 and EP-A-0 479 362 also disclose the provision of temperature sensors in hot (central) and cold (peripheral) areas of the power device and the use of a comparator circuit responsive to these differently-located sensors for providing a control signal for switching off the power device when the difference in temperature sensed in these areas reaches a predetermined value. Such an arrangement may be adopted in a power device in accordance with the present invention with each of the thin-film sensing elements having an electrical screen formed in accordance with the invention. However, a power device in accordance with the present invention may comprise just one highly-sensitive thin-film sensing element located in a single area of the device and electrically screened in accordance with the invention.

The thin-film sensing element may be formed in a variety of ways. The sensing element may be in the form of a thermistor having a thin-film of thermistor material with either a positive or a negative temperature coefficient of resistivity. A thin-film thermo-couple may form the sensing element. However, a particularly high temperature-sensitivity can be obtained using one or more thin-film diodes as the sensing element. Most power semiconductor devices are based on silicon technology, and so it is particularly convenient for the thin-film sensing element to comprise a silicon film pattern sandwiched between the first and second electrically insulating layers. The diode(s) can be formed readily in this silicon film pattern.

The thin-film sensing element may comprise a p-n diode formed by a p-n junction extending vertically across such a silicon film pattern between two laterally adjacent regions of the silicon film pattern which are of mutually opposite conductivity type. Such a diode configuration for a temperature sensing element is already known in EP-A-0 414 499 and EP-A-0 224 274. As in both EP-A-0 224 274 and EP-A-0 414 499, the change with temperature of the forward characteristic of the p-n diode may be used for temperature sensing. However, in accordance with the present invention, the inclusion of an electrical screen formed over and under the thin-film circuit element permits the stronger temperature dependence of a reverse-biased p-n thin-film diode to be used as the thin-film temperature sensing element. It is convenient to integrate circuit means in the device for reverse biasing the p-n junction and for sensing the leakage current of the reverse-biased p-n junction. Although the high impedance characteristic of such a reverse-biased p-n junction is particularly susceptible to electrical noise, the effects of that noise can be significantly reduced in accordance with the present invention by screening the whole of the reverse-biased p-n junction between the underlying semiconductive region and the overlying electrically conductive region. In order to ensure good screening of the p-n junction from electromagnetic radiation generated in the operational environment of the power semiconductor device, the electrically conductive layer may be electrically connected to the semiconductive region around most of the perimeter of the p-n junction. Alternatively, at least along a side where the electrically conductive layer is not electrically connected to the semiconductive region, both the underlying semiconductive region and the overlying electrically conductive region preferably extend laterally beyond the p-n junction by a distance which is at least 5 times (and preferably 10 times) the total intermediate thickness of the first and second electrically insulating layers.

Particularly (but not exclusively) when the p-n junction is reverse-biased, it is advantageous to increase the width of the p-n junction in order to increase the strength of the signal. For this purpose, the p-n junction may meander across a width of the silicon film pattern, between interdigitated portions of the two laterally adjacent regions of the silicon film pattern of mutually opposite conductivity type. The provision of the electrical screen over and under the p-n junction permits this increase in width of the p-n junction without increasing the incidence of false temperature indications as a result of electrical noise.

When the thin-film sensing element is formed in a silicon film pattern, the silicon film pattern may be used for other functions in the power semiconductor device. Thus, the silicon film pattern may extend beyond the thin-film sensing element as an electrical connection to another part of the device (for example an insulated gate of a sense transistor formed in and on the semiconductor body). An extension of this silicon film pattern may form the gate of this sense transistor. If the device comprises other insulated gate transistors, one or more of these other gates may also be formed by parts of the silicon film pattern. Thus, for example, when the power semiconductor device is an insulated-gate field-effect transistor or an insulated-gate bipolar transistor, the gate of this power transistor may be fabricated from the silicon film pattern a part of which provides the thin-film temperature sensing element.

BRIEF DESCRIPTION OF THE DRAWING

These and other features in accordance with the present invention are illustrated specifically in embodiments of the invention now to be described, by way of example, with reference to the accompanying diagrammatic drawings. In these drawings.

Figure 1:
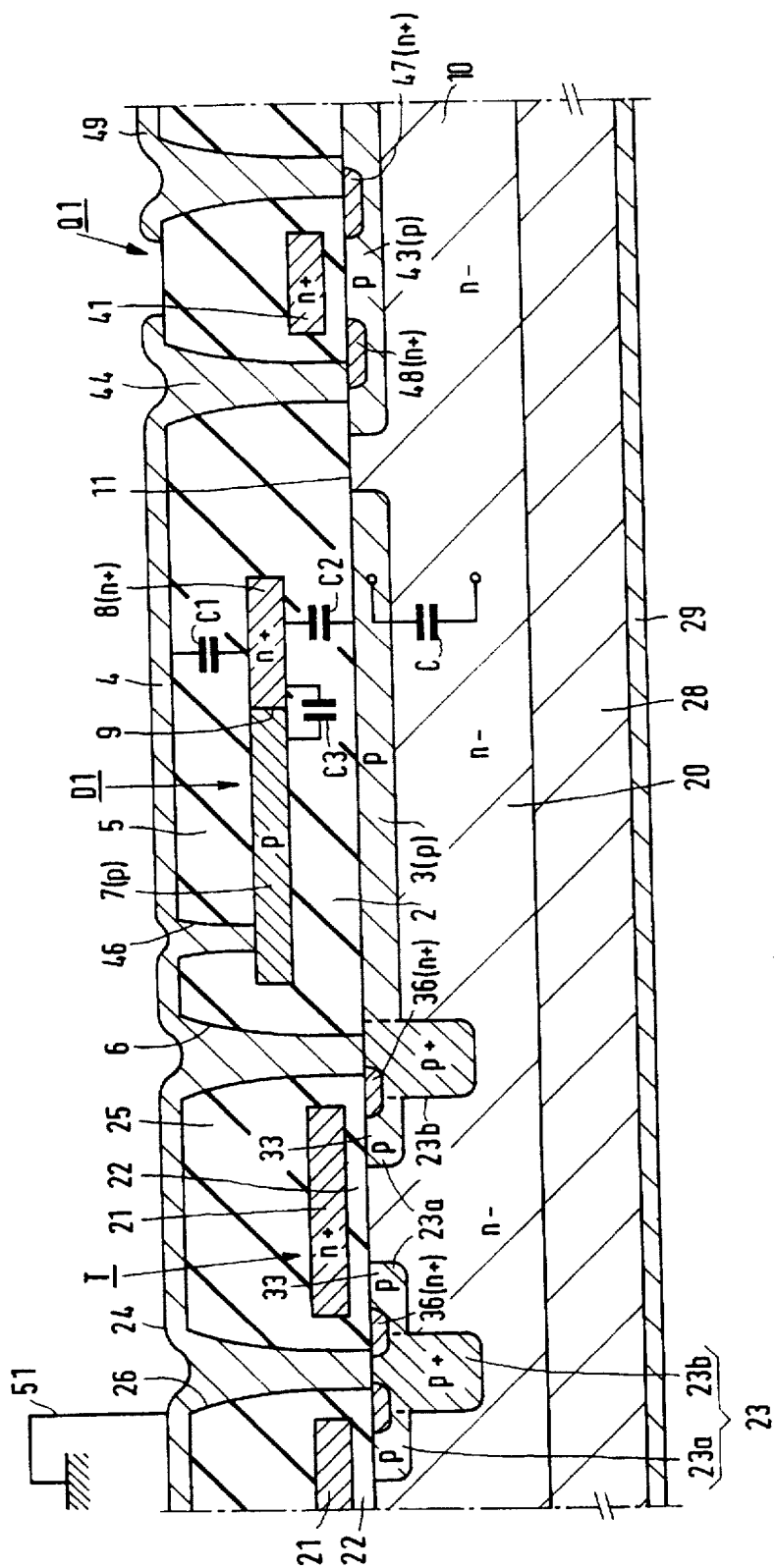
FIG. 1 is a cross-sectional view of part of a power semiconductor device in accordance with the present invention.

It should be noted that all the drawings are diagrammatic. The cross-sectional and plan views of FIGS. 1, 2, 5 and 6 are not drawn to scale, but relative dimensions and proportions of parts of these Figures have been shown exaggerated or reduced in size for the sake of clarity and convenience in the drawings. The same reference signs are generally used to refer to corresponding or similar features in different embodiments.

DESCRIPTION OF THE PREFERRED EMBODIMENTS

Figure 2:
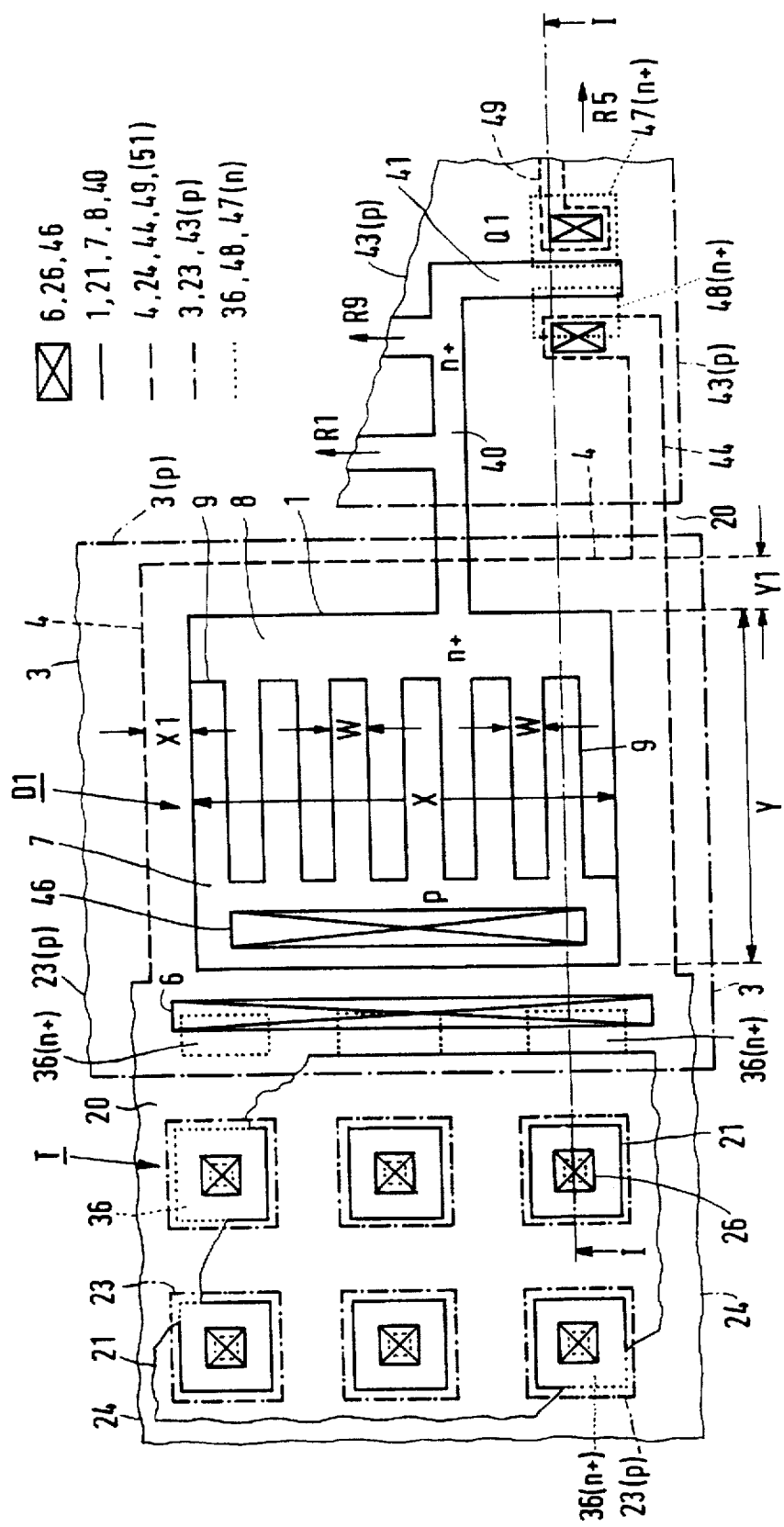
FIG. 2 is a plan view of the power semiconductor device part of FIG. 1, the cross-section of FIG. 1 being taken on the line I—I of FIG. 2.

The power semiconductor device of FIGS. 1 and 2 comprises a semiconductor body 10 in which heat is generated during operation of the power semiconductor device. Adjacent to one major surface 11 of the body 10, a thin-film sensing element D1 is present on a first insulating layer 2 on a semiconductive region 3 of the body 10 to form a temperature sensing means for the body 10. In accordance with the present invention an electrically conductive layer 4 is present on a second electrically insulating layer 5 over the thin-film sensing element D1 and forms part of an electrical screen 3,4 which is present over and under the thin-film sensing element D1. This electrical screen 3,4 is formed by the electrically conductive layer 4 overlying at least substantially the whole of the thin-film sensing element D1 and by the semiconductive region 3 underlying at least substantially the whole of the thin-film sensing element D1, and by the electrically conductive layer 4 being electrically connected to the semiconductive region 3, e.g. at a window 6 in the insulating layers 2 and 5 as shown in FIGS. 1 and 2. This arrangement of the conductive layer 4 connected to the semiconductive region 3 serves to screen the diode D1 from electrical noise and so reduces false indications of the body temperature.

Figure 3:
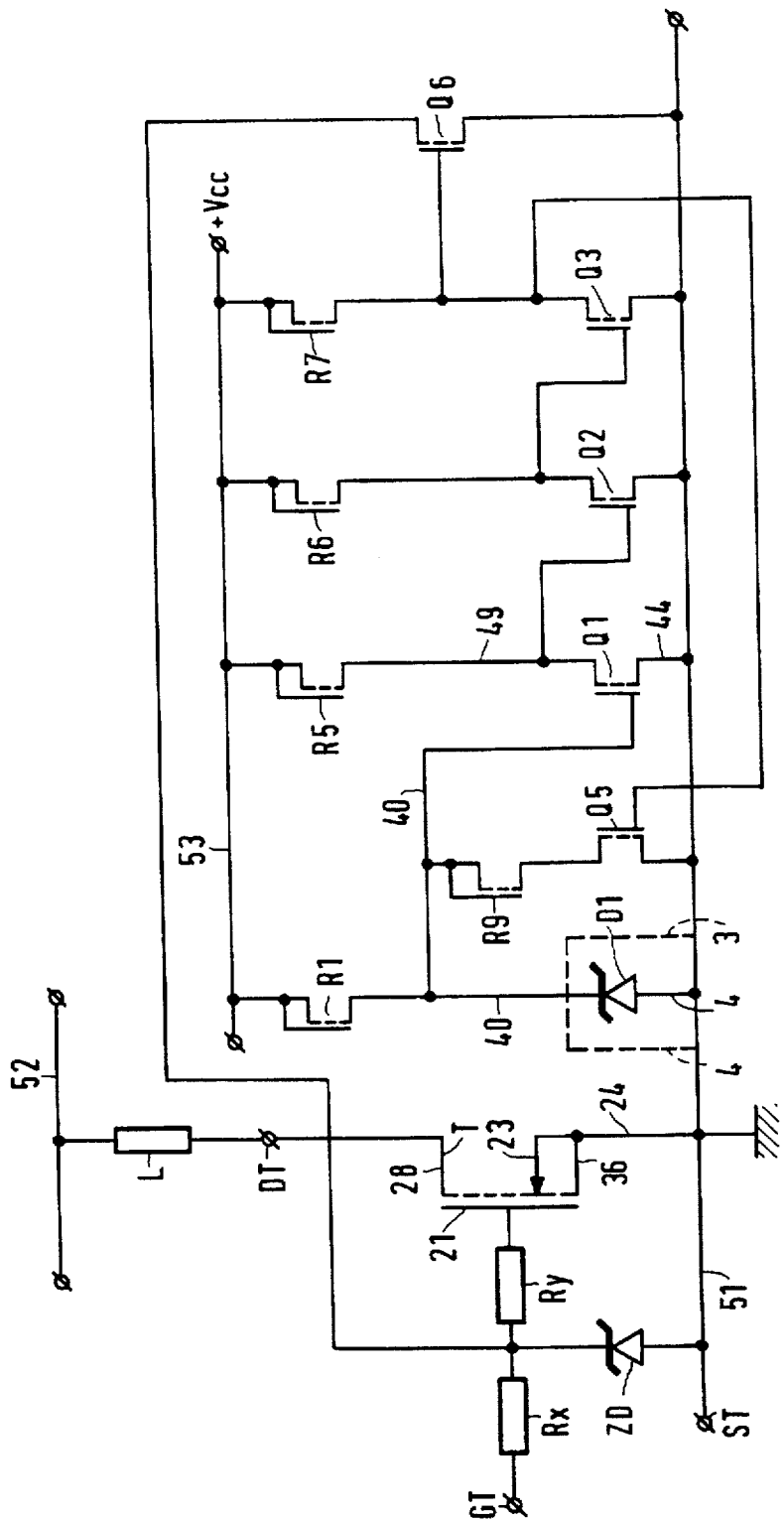
FIG. 3 is a circuit diagram illustrating a specific example of sense and control circuitry which may be integrated in the power semiconductor device of FIGS. 1 and 2, with the device switching an external load L.

The power semiconductor device of FIGS. 1 and 2 comprises a power transistor T which may be a MOSFET or an IGBT. By way of example, a power MOSFET T is shown in the circuit diagram of FIG. 3. The power transistor T is of cellular form, each cell comprising a region 23 of one conductivity type which accommodates a channel area 33 of the transistor below an insulated gate 21. The transistor T illustrated in FIGS. 1 to 3 is of the n-channel enhancement type having a p-type region 23. This cellular power transistor T may be designed and fabricated in known manner, with for example a shallow p-type region 23a (in which the conductive channel is induced) and a deeper central p-type region 23b of much higher doping concentration. Each cell has individual n-type source regions 36 in the p-type region 23. The cellular regions 23 are present in an n-type drain drift region 20 of high resistivity (n−).

The insulated gate 21 may be formed by a doped polycrystalline silicon layer pattern on a dielectric layer 22 on the surface 11 of the semiconductor body 10. The insulated gate 21 serves for controlling current flow (electrons in the case of this n-channel device) in the channel area 33 in the current path between the main electrodes of the device. Gate 21 is covered with a further insulating layer 25 which may be of a flowable glass or polymer material so as to give a smooth flat upper surface across the device.

One of the main electrodes of the device (the source electrode in the case of a MOSFET, and the cathode electrode in the case of an IGBT) is formed by an electrically conductive layer 24 (for example of aluminium) which contacts the source regions 36 and the body regions 23 at windows 26 in the insulating layers 22,25. This first main electrode 24 extends over the insulated gate 21 between the windows 26. The device of FIGS. 1 and 2 is a vertical transistor and so has a second main electrode 29 (drain electrode for a MOSFET or anode electrode for an IGBT) at the opposite major surface of the body 10 from that of surface 11. This second main electrode 29 contacts a substrate 28 of the body 10 which is of the same conductivity type as the drain drift region 20 in the case of a MOSFET and is of opposite conductivity type to the drain drift region 20 in the case of an IGBT. Thus, the cellular device structure of the power transistor of FIGS. 1 and 2 is of known type. The power transistor T may be designed for switching a load L such as, for example, an automotive lamp.

In the embodiment of FIGS. 1 and 2, the thin-film sensing element D1 is located to one side of the insulated gate 21. This location may be towards an outer perimeter of the power transistor. In the embodiment of FIGS. 1 and 2, the screening semiconductive region 3 also forms part of the power transistor. Thus, as illustrated, the screening region 3 may be a lateral extension of a peripheral cellular region 23 in which a peripheral part of the channel area 33 of the power transistor is formed. As illustrated in FIGS. 1 and 2, a source region 36 of the power transistor may be present in the semiconductor region 3,23, being located between the channel area 33 and a contact area at the window 6 where the electrically conductive layer 4 is connected to the semiconductive region 3. In the embodiment of FIGS. 1 and 2, the screening conductive layer 4 of the sensing element D1 is an extension of the main electrode 26 of the power semiconductor device adjacent to the major surface 11. The thin-film sensing element D1 may be formed in a separate part of a silicon film pattern 1 which provides the insulated gate 21 of the power transistor.

Thus, in this particular embodiment, the screening semiconductive layer 3 may be formed in the same process steps as the power transistor regions 23, the screening conductive layer 4 may be formed in the same process steps as the main electrode layer 24, the sensing element D1 may be formed in the same silicon film pattern 1 as the insulated gate 21 of the power transistor T, the insulating layers 2 and 5 between which the element D1 is sandwiched may be formed in the same process steps as the insulating layers (e.g. layers 22 and 25) of the power transistor T, and the window 6 for connecting the screening layer 4 to the screening region 3 may be formed in the same process steps as the contact windows 26 of the power transistor T. Thus, the integration of this screen 3,4 around the thin-film sensing diode D1 can be realised in the same process steps as are already known for power device fabrication, but with modified mask layouts for providing the desired geometry in accordance with the invention.

In the layout illustrated by way of example in FIG. 2, different outlines are used to distinguish the different parts more clearly. Thus, except where cut back to reveal underlying regions and at the edges of the drawing, the following outlines are used in FIG. 2 for the following regions:

solid line for the polycrystalline silicon pattern 1 (e.g. regions 21,(7,8) and 40);

dashed line for the conductive overlayer 4,24,44,(51);

dash-dot line for the p-type regions 3,23,43 in the body 10;

dot line for the n+ regions 36,47,48 in the p-type regions of the body 10; and

X in-fill for contact windows (6,26,46) in the insulating layers.

The thin-film sensing element D1 of FIGS. 1 to 3 comprises a p-n diode formed by a p-n junction 9 which extends vertically across the silicon film pattern 1. This p-n junction 9 is formed between two laterally adjacent regions 7 and 8 of the silicon film pattern 1. In the embodiment shown by way of example, the region 7 is of p-type conductivity, whereas the region 8 is of n-type conductivity. As shown in the plan view of FIG. 2, this p-n junction 9 meanders across a width X of the silicon film pattern 1, between interdigitated portions of the two laterally adjacent regions 7 and 8 of mutually opposite conductivity type. In this manner, a p-n junction 9 of large area is obtained, in spite of the small thickness of the silicon film pattern 1.

In the embodiment of FIGS. 1 and 2, one electrical connection of the thin-film diode D1 is formed by the screening conductive layer 4 (and hence the main electrode layer 24) extending through a contact window 46 in the second electrically insulating layer 5. The other electrical connection of the thin-film diode D1 is formed by the silicon film pattern 1 extending beyond the thin-film diode D1 as a highly-doped n-type connection track 40. This connection track 40 extends to an insulated gate 41 of a sense transistor Q1 and also to resistor elements R1 and R9 in the circuit of FIG. 3. The transistor Q1 and resistor elements R1 and R9 (together with the other transistors Q2 to Q6 and resistor elements R5 to R9 shown in FIG. 3) form part of a low-voltage sense and control circuit which is integrated in and on the semiconductor body 10.

In the circuit configuration of FIG. 3, the MOSFET T serves as a so-called "low-side" switch between the external load L and ground. Thus, the source terminal ST of the MOSFET T is connected via its electrode 26 to a ground line 51, whereas the drain terminal DT (electrode 29) of the transistor is connected via the external load L to a high-voltage supply line 52.

With the device structure of FIGS. 1 and 2, the screen formed by the conductive layer 4 and semiconductive region 3 is connected in the circuit to a stable reference potential, which in this particular case is the source potential of the MOSFET T. Thus, in the case of a low-side switch as illustrated in FIG. 3, the screen 3,4 is connected to ground potential. The conductive layer 4 connected to the semiconductive region 3 together act as a grounded Faraday screen.

The sense and control circuit Q1 to Q6 and R1 to R8 may be integrated in and on a second region 43 which is of the same conductivity type as region 3 but which may be separated in the semiconductor body 10 from the region 3, for example by the drain-drift region 20. The resistor element R1 acts as a current source between the temperature sensing diode D1 and a voltage supply line ($V_{cc}$) 53. By this circuit connection of the diode D1 between the resistor element R1 and the ground line 51, the p-n junction of the diode D1 is reverse-biased at a voltage below its breakdown voltage. The only current through the resistor element R1 and the thin-film diode D1 is the reverse leakage current of the diode D1. This leakage current increases exponentially with the Absolute Temperature. In the temperature range 100° C. to 200° C., the leakage current of such a reverse-biased p-n thin-film diode approximately doubles for each 8° C. increase in temperature. Thus, a strong temperature dependence is obtained for this thin-film sensing element by operating this diode D1 under reverse-bias. The magnitude of this leakage current depends on the junction area of the diode D1 and on the resistance value of the resistor element R1. The transistor-resistor pairs (Q1,R5), (Q2,R6), (Q3,R7) function as invertors which form an output stage for the signal from the circuit node between the sensing diode D1 and the resistor element R1. As a result of gain in each of the inverter stages (Q1,R5), (Q2,R6), (Q3,R7) of the output inverter stage, the magnitude of the small leakage current signal of diode D1 is amplified by transmission through this output stage. The circuit node between transistor Q3 and resistor element R7 is coupled to the gate of an output transistor Q6, whose drain is connected to the gate input circuit of the power MOSFET T so as to switch off the power MOSFET T when the temperature sensed by the thin-film diode D1 exceeds a predetermined value. The gate input circuit of the MOSFET T may be of any known form. In the particular example illustrated in FIG. 3, this gate input circuit comprises two series resistors Rx and Ry between the gate terminal GT of the device and the insulated gate 21, and a Zener diode ZD between the source terminal ST and the circuit node of resistors Rx and Ry. In this case, the drain of the output transistor Q6 of the sense circuit is coupled to the circuit node of resistors Rx and Ry.

All the transistors Q1 to Q6 and all the resistor elements R1 and R5 to R9 may be integrated in and on the same circuit region 43. The transistors Q1 to Q6 are n-channel enhancement-type lateral MOS transistors having n-type source and drain regions (e.g. regions 48 and 47 of Q1). The resistor elements R1 to R9 may be formed in known manner as lateral MOS transistors having their gate electrodes connected to their drains. Alternatively, some or even all of the resistor elements R1 to R9 may be formed as thin-film resistors on an insulating layer on the device body 10. The resistance values of R1 (and R9, described later) are chosen to give a reasonable current level (e.g. about 10 µA) for switching the output stage of FIG. 3 when the diode D1 has at a predetermined junction temperature (e.g. around 180° C.). The resistance values of R5 to R7 are chosen to give a desired gain level in the output stage of FIG. 3. The transistor-resistor pairs (Q1,R5), (Q2,R6), (Q3,R7) are coupled between the ground line 51 and the voltage supply line 53.

When the temperature of the body 10 is low, the reverse leakage current through the thin-film sensor diode D1 is very low. In this situation the gate of transistor Q1 is high, so that Q1 is on, Q2 is off and Q3 is on. Thus, the sense output of the circuit node of Q3 and R7 is low so that output transistor Q6 is off and so does not affect the gate control circuit Rx,Ry,ZD of the power MOSFET T.

As the temperature of the body 10 increases, the reverse current flowing through D1 increases, and so the voltage on the gate of transistor Q1 falls. When the voltage on the gate of Q1 falls below the threshold voltage of the inverter formed by Q1 and R5, the sense output at the circuit node of Q3 and R7 goes high. Thus, the voltage on the gate of output transistor Q6 goes high so reducing the voltage on the insulated gate of the MOSFET T, thereby switching off the MOSFET T. The junction area of the diode D1 and the resistance value of the resistor R1 are selected to determine the magnitude of the output signal for a given body temperature and the actual body temperature at which the switching occurs. Typically this output current may be in the range of $10^{-6}$ to $10^{-5}$ amps. Thus, the magnitude of the reverse leakage current of diode D1 which provides the temperature indication is small. However, the provision of the electrical screen 3.4 around the diode D1 reduces the sensitivity of the circuit to randomly generated noise and so reduces false indications of excess temperature. Such noise may arise and/or be transmitted in an inductive or capacitive manner from the environment around the power semiconductor device of FIGS. 1 and 2 and/or from various parts of this power semiconductor device and its integrated control and logic circuitry of, for example, FIG. 3.

In an automotive application, for example, problematic excursions in voltage levels and current levels may result, for example, from switching an inductive load L and/or from operational fluctuations of the electrical supply affecting lines 51, 52, 53 and perhaps the input signal at gate terminal GT. Noise may result from voltage spikes on these supply lines of the power semiconductor device. Radiated noise may arise in the form of electromagnetic interference from, for example, the high voltage ignition coils of the automotive internal-combustion engine, and/or from an audio system in the automobile and/or from an automotive radar system. The electrical screen 3.4 formed in accordance with the present invention can significantly reduce the effect of such noise on the output signal of the reverse-biased diode D1, both directly from the environment outside the semiconductor device and indirectly (e.g. as capacitive currents) from other parts of the semiconductor device. Capacitive currents which may be problematic in prior art device structures (e.g. in the device structures of EP-A-0 224 274, EP-A-0 414 499, EP-A-0 409 214, and EP-A-0 488 088) can be reduced (and some eliminated) by electrically screening the thin-film sensing element D1 in this manner, and a highly sensitive reverse-biased diode D1 can be used to give more reliable temperature indications.

Within the semiconductor body 10 the substrate regions 20 and 28 which are associated with the opposite electrode 29 and load terminal DT of the device can be a particularly bad source of noise. At some locations this region 20 (the drain drift region) extends to the top surface 11 of the device, and this surface 11 is where most multiple regions and components of the device are provided (including sensor D1). Circuit wells such as the region 43 have large-area reverse-biased p-n junctions with the region 20, as a result of which large capacitive currents (e.g. of the orders of tens or hundreds of milliAmps) may flow in these regions as a result of dV/dt excursions and transient currents. The screen 3.4 provided in accordance with the invention can protect the sensor diode D1 from giving a false output as a result of these large currents in neighbouring regions and circuit components. Capacitive currents in these regions 43 and in region 3 are drained to ground by the circuit connections 4, 24, and 44 to source terminal line 51 in FIG. 3. Thus, for example, FIGS. 1 and 2 illustrate a connection track 44 of the source metallisation 24, 4 (and hence of the ground line 51) contacting both the n-type source region 48 of Q1 and the p-type circuit region 43. Even though regions 3 and 43 in the embodiment of FIGS. 1 and 2 are biased to the same stable reference voltage (ground potential in this example), the screening region 3 is separate from the circuit region 43. The temperature sensor D1 is therefore isolated from parasitic components and leakage currents within the circuit of region 43. The diode D1 is screened from capacitive coupling to the circuit region 43 and is also screened from capacitive coupling to the drain-drift region 20 by the region 3.

In a specific example of the device of FIGS. 1 and 2, typical dimensions and compositions for the various regions and layers are as follows:

05. to 5 µm thickness for conductor layer 4.24 of, for example, aluminium;

0.5 to 2 µm thickness of silicon dioxide for the insulating layers 5,25;

0.2 to 5 µm thickness of polycrystalline silicon for the layer pattern 1 (9,21,41 . . . );

0.3 to 2 µm thickness of silicon dioxide for the insulating layers 2,22;

0.1 to 3 µm depth of p-type region 3 with boron doping concentration of $10^{13}$ to $10^{18}$;

Several hundred µm for the transverse dimensions X and Y (see FIG. 2) of the polycrystalline silicon film pattern area of the diode D1;

5 to 20 µm (e.g. 10 µm) for the extensions X1 and Y1 (see FIG. 2) of the screening parts 3 and 4 beyond the area of the diode D1;

Several µm (e.g. 5 µm) for the width W (see FIG. 2) of each p-type and n-type finger portion of the interdigitated regions 7 and 8 of the diode D1;

A meandering width of several thousand µm for the p-n junction 9 of the diode D1.

The doping concentrations of the p-type and n-type regions 7 and 8 of the diode D1 may be about $10^{18}$ boron $cm^{-3}$ and about $10^{19}$ to $10^{20}$ arsenic $cm^{-3}$ respectively.

Typically, such a reverse-biased thin-film polycrystalline silicon diode having a junction area of the order of $10^4$ $\mu m^2$ may give a reverse leakage current of between 5 µA and 10 µA at a junction temperature of 180° C. This current level may be used as the switching level in the circuit output stage of FIG. 3.

The dimensions, materials and doping concentrations of other parts of the device structure of FIGS. 1 and 2 and the circuit values of FIG. 3 may be designed in known manner in accordance with prior art type power semiconductor devices.

The circuit of FIG. 3 using this screened reverse-biased diode D1 has a fast response to changing temperature in the semiconductor body 10. It may be switched in less than 10 µsec, which is much quicker than the thermal time constants in the device body 10. As a consequence it is relatively easy to enhance the circuit of FIG. 3 with a feed-back loop so as to introduce hysteresis into the circuit. This is achieved in the circuit of FIG. 3 by including feed-back to a transistor Q5 and a resistor element R9 between the ground line 51 and the gate of transistor Q1. The feed-back is taken from the circuit node of the transistor-resistor pair Q3 and R7 in the final inverter of the output stage, and is fed to the gate of the transistor Q5. This hysteresis circuit prevents the temperature sensing circuit of FIG. 3 from hunting or cycling, that is from continually causing the power transistor T to switch on and off with small temperature changes. The use of the screened reverse-biased diode D1 with this circuit of FIG. 3 results in well-defined and reproducible switching at a predetermined temperature with very few false temperature indications.

The power semiconductor device of FIGS. 1 to 3 may include low-voltage logic circuitry in addition to the sense and control circuitry shown in FIG. 3, and so may be a so-called "smart" power device. This additional logic circuitry may be integrated in and on the circuit region 43 or in and on another circuit region which is also separate from the region 3,23.

The power semiconductor device of FIGS. 1 to 3 may be a 3-terminal device having external source, drain and gate terminals ST, DT and GT respectively. In this case the supply voltage $V_{cc}$ for line 53 may be coupled (via a voltage-level changing circuit) to input circuitry at the gate terminal GT. However, the power semiconductor device in accordance with the present invention may have an additional external terminal for the $V_{cc}$ voltage supply for the line 53, and possibly an additional temperature sense output terminal which is connected to the circuit mode of Q3 and R7 and so replaces the output transistor Q6.

Figure 4:
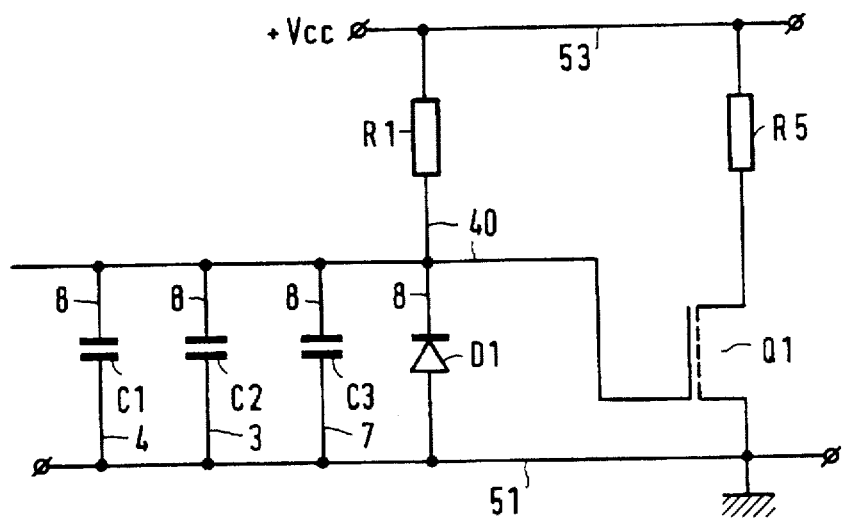
FIG. 4 is a circuit diagram of part of the device structure and circuit of FIGS. 1 and 2, showing parasitic capacitances.

FIGS. 1 and 4 illustrate parasitic capacitances C, C1, C2 and C3 which are present in the device structure of FIG. 1 around the thin-film diode D1. The effect of the parasitic p-n junction capacitance C between the screening region 3 and the drain drift region 20 is reduced by separating the smaller area of region 3 from the much larger area of circuit region 43 and is neutralised by connecting the region 3 to a stable reference voltage (ground potential in this example). An efficient connection of the region 3 to ground is provided at the contact window 6. The p-type region 7 and the overlying screening layer 4 are also connected to this same potential. The n-type region 8 of the diode D1 is at a different potential because of the reverse-biasing of the p-n junction 9. Thus, there are parasitic capacitances C1 between the region 8 and the overlying screening layer 4, C2 between the region 8 and the underlying screening region 3, and C3 across the p-n junction 9 between the regions 7 and 8. For optimum performance it is desirable to minimise these capacitance values of C1, C2 and C3. The junction capacitance C3 is much smaller than that present in a substrate p-n diode sensor such as disclosed in EP-A-0 409 214 and EP-A-0 488 088. The upper insulating layer 25,5 in a power semiconductor device is typically quite thick, so reducing the capacitance C1 across this dielectric layer 5 between a conductive layer 4 and the diode region 8. In FIG. 1, the diode D1 is shown formed on an insulating layer 2 which is thicker than the gate dielectric layer 22 of the power transistor T. This thick insulating layer 2 may be an area of the field-oxide layer present in the power transistor T. Thus, the capacitance C3 across this dielectric layer 2 between the diode region 8 and the screening region 3 is reduced. In spite of the provision of the temperature-sensing diode D1 on a thick insulating layer 2, it is possible to obtain an extremely fast and sensitive temperature sensing means for the semiconductor body 10 in accordance with the present invention by the use of reverse-biased p-n junction thin-film diode D1 with its electrical screening 3,4.

Figure 5:
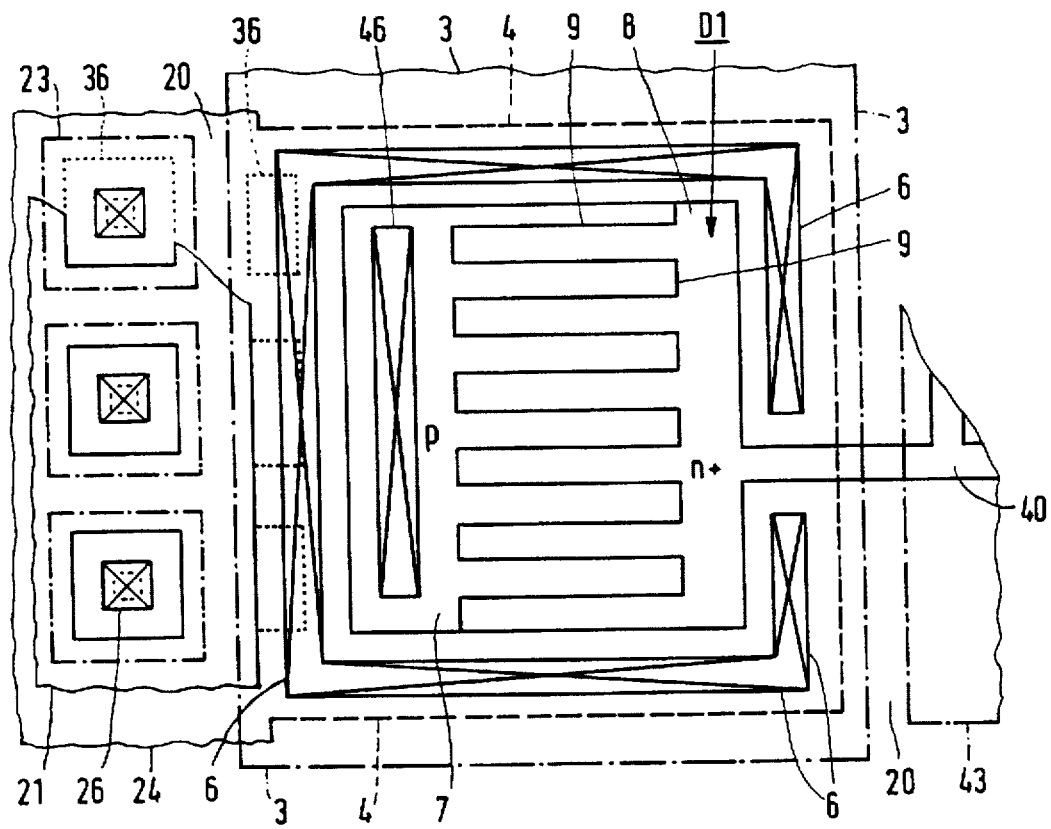
FIG. 5 is a plan view of a thin-film sensor area similar to that of FIG. 2, showing a side-screening modification.

Many modifications are possible within the scope of the present invention. In the plan view of FIG. 2, the contact window 6 for the connection between the overlying conductive layer 4 and the underlying semiconductive region 3 of the screen 3,4 only extends along one side of the diode element D1. FIG. 5 illustrates a modification in which this contact window 6 extends side-by-side with the thin-film sensing element D1 along the whole of three sides of D1 and along most of a fourth side. Thus, at the fourth side there is an interruption in the contact window 6 only where the polycrystalline silicon connection track 40 extends from the sensing element D1. This arrangement provides very efficient side screening of D1 and also very efficient draining of capacitive currents from the region 3 to the ground line 51. However, depending on the layout tolerances between the contact window 6 and other neighbouring regions in the device structure, this connection arrangement may require a larger layout area than merely extending the layer 4 and region 3 sideways beyond the element D1 as in FIG. 2.

Figure 6:
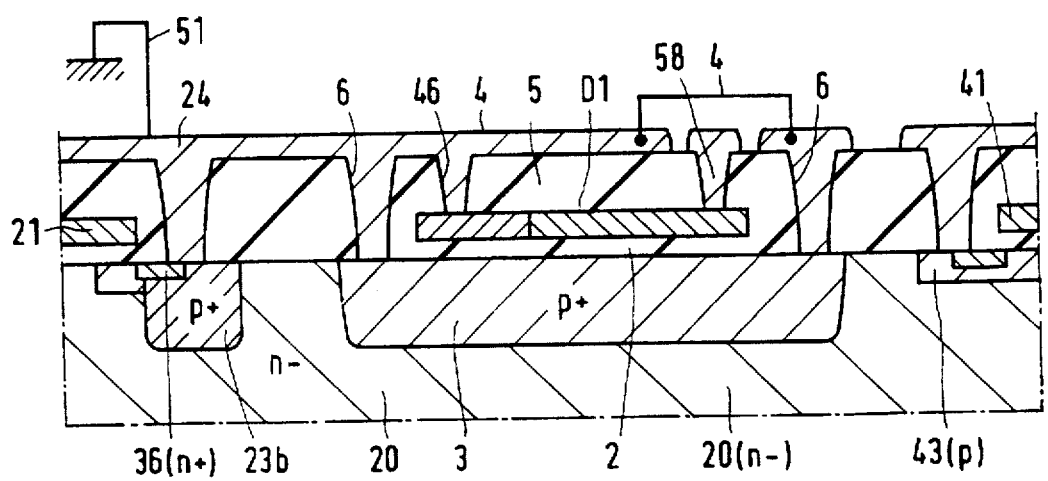
FIG. 6 is a cross-sectional view of a thin-film sensor area similar to that of FIG. 1, showing further modifications.

The thin-film p-n diode D1 and its sense circuitry may be designed for operation with forward bias of the p-n diode junction 9. Furthermore, quite different types of temperature sensing element may be used. For example, thin-film thermistors or thin-film thermo-couples. Although FIG. 1 illustrates the thin-film sensor D1 on a thick insulating layer 2, the sensor D1 may be provided on a thinner insulating layer, for example a layer 2 formed in the same process steps as the gate dielectric 22 of the power transistor T. Such an arrangement is illustrated in FIG. 6. Although it is convenient to extend the thin-film pattern of D1 so as to form an electrical connection of D1, both of the electrode connections to D1 may be in the form of metal electrodes extending through contact windows in the upper insulating layer 5. Such an arrangement is illustrated with an electrode connection 58 in FIG. 6. The contact window 6 for the connection between the conductive screening layer 4 and the underlying semiconductive screening region 3 may now extend around the whole perimeter of the sensing element D1.

In FIG. 1 the screening semiconductive region 3 is illustrated as a shallow p-type region which may be formed with a doping concentration and depth similar to those of the shallow p-type regions 23a of the power transistor T. In FIG. 6 the screening semiconductive region 3 is illustrated as a deep p-type region which may be formed with a doping concentration and depth similar to those of the deep p-type regions 23b of the power transistor T. Although FIGS. 1 and 2 show the screening semiconductive region 3 as an integral extension part of the power transistor region 23, the regions 3 and 23 may be separated from each other, for example as illustrated in FIG. 6. Particularly when the region 3 is well-grounded (for example, by the connection in contact window 6 around at least most of the perimeter of the sensor D1 and by a highly conductive doping concentration, as in FIG. 6), the regions 3 and 43 need not be separated from each other.

In FIGS. 1 to 5 a single p-n junction diode was illustrated as the temperature sensing element. However, a plurality of screened diodes (in series and/or back-to-back) may be used as the thin-film sensing element in a device in accordance with the present invention, for example, to increase the withstand voltage of the sensing element.

It was suggested earlier that the resistor element R1 which connects the thin-film diode D1 to the supply line 53 may be formed as a thin-film resistor. If desired, this thin-film resistor R1 may be screened in the same manner as the diode D1. Thus, for example, the thin-film elements R1 and D1 may be sandwiched between the insulating layers 2 and 5, between the underlying screening semiconductive region and the overlying screening conductive layer 4.

It was suggested earlier that the screened thin-film temperature sensor D1 may be located towards an outer perimeter of the power transistor T. In this case, the sense circuitry of FIG. 3 may be located in a circuit region 43 in the vicinity of the screening region 3, as illustrated in FIGS. 1 and 2. However, the use of this screened reverse-biased thin-film p-n junction diode D1 with the circuit of FIG. 3 provides a very sensitive, very fast, and very reliable temperature sensing means. This particular screened thin-film diode structure 3,4,D1 may alternatively be provided at a central location in the power transistor area and connected by a conductive track 40 to the sensing circuit in a circuit region 43 towards an outer perimeter of the power device.

From reading the present disclosure, other variations and modifications will be apparent to persons skilled in the art. Such variations and modifications may involve equivalent and other features which are already known in the design, manufacture and use of power semiconductor devices, temperature sensing circuits for such devices, and component parts thereof and which may be used instead of or in addition to features already described herein.

I claim:

1. A power semiconductor device comprising a semiconductor body in which heat is generated during operation of the power semiconductor device, a first electrically insulating layer adjacent to one major surface of the body, which first insulating layer is present on an underlying semiconductive region of the body, and a temperature sensing means for the body comprising a thin-film sensing element which is present on the first insulating layer on the semiconductive region, characterised in that an electrically conductive layer is present on a second electrically insulating layer over the thin-film sensing element, and in that an electrical screen is present over and under the thin-film sensing element, the electrical screen being formed by the electrically conductive layer overlying the thin-film sensing element and by the semiconductive region underlying the thin-film sensing element, and by the electrically conductive layer being electrically connected to the semiconductive region.

2. A power semiconductor device as claimed in claim 1, further characterised in that the electrically conductive layer extends through a contact window in the second electrically insulating layer to form one electrical connection of the thin-film sensing element and has a circuit connection for connecting said one electrical connection of the thin-film sensing element to a stable reference potential in operation of the device.

3. A power semiconductor device as claimed in claim 2, further characterised in that the electrically conductive layer is a main electrode of the power semiconductor device adjacent to the said one major surface of the body.

4. A power semiconductor device as claimed in claim 1, further characterised in that the electrically conductive layer is electrically connected to the semiconductive region through an elongate contact window which extends side-by-side with the thin-film sensing element along one side of the sensing element.

5. A power semiconductor device as claimed in claim 4, further characterised in that the elongate contact window extends side-by-side with the thin-film sensing element around most of the sensing element.

6. A power semiconductor device as claimed in claim 1, further characterised in that the thin-film sensing element comprises a silicon film pattern sandwiched between the first and second electrically insulating layers.

7. A power semiconductor device as claimed in claim 6, further characterised in that the thin-film sensing element comprises a p-n diode formed by a p-n junction extending vertically across the silicon film pattern between two laterally adjacent regions of the silicon film pattern which are of mutually opposite conductivity type.

8. A power semiconductor device as claimed in claim 1, further characterised in that, at least along a side where the electrically conductive layer is not electrically connected to the semiconductive region, both the underlying semiconductive region and the overlying electrically conductive layer extend laterally beyond the p-n junction of the thin-film sensing element by a distance which is at least 10 times larger than a total intermediate thickness of the first and second electrically insulating layers.

9. A power semiconductor device as claimed in claim 7, further characterised in that circuit means are integrated in the device for reverse biasing the p-n junction and for sensing the leakage current of the reverse-biased p-n junction, the whole of the reverse-biased p-n junction being located between the underlying semiconductive region and the overlying electrically conductive region.

10. A power semiconductor device as claimed in claim 6, further characterised in that the p-n junction meanders across a width of the silicon film pattern, between interdigitated portions of the two laterally adjacent regions of the silicon film pattern of mutually opposite conductivity type.

11. A power semiconductor device as claimed in claim 6, further characterised in that the silicon film pattern extends beyond the thin-film sensing element as an electrical connection to an insulated gate of a sense transistor formed in and on the semiconductor body.

12. A power semiconductor device as claimed in claim 1, further characterised in that the semiconductive region underlying the thin-film sensing element is a first region of one conductivity type which is separated in the semiconductor body from a second region of the one conductivity type also adjacent to the one major surface, and the thin-film sensing element is electrically connected to sense circuitry integrated in and on the second region.

13. A power semiconductor device as claimed in claim 1, further characterised in that the power semiconductor device is of a type comprising an insulated gate for controlling current flow in a channel area of the device in operation of the device, in that the thin-film sensing element is located to one side of the insulated gate, and in that the said semiconductive region which provides the electrical screen under the thin-film sensing element has an integral part of the one conductivity type in which the channel area is formed.

14. A power semiconductor device as claimed in claim 13, further characterised in that a source region of opposite conductivity type is present in the said semiconductive region between the channel area and a contact area where the electrically conductive layer is connected to the said semiconductive region.

15. A power semiconductor device as claimed in claim 8, further characterized in that circuit means are integrated in the device for reverse biasing the p-n junction and for sensing the leakage current of the reverse-biased p-n junction, the whole of the reverse-biased p-n junction being located between the underlying semiconductive region and the overlying electrically conductive region.

16. A power semiconductor device as claimed in claim 8, further characterized in that the p-n junction meanders across a width of the silicon film pattern, between interdigitated portions of the two laterally adjacent regions of the silicon film pattern of mutually opposite conductivity type.

17. A power semiconductor device as claimed in claim 8, further characterized in that the silicon film pattern extends beyond the thin-film sensing element as an electrical connection to an insulated gate of a sense transistor formed in and on the semiconductor body.

* * * * *